United States Patent
Honda et al.

(10) Patent No.: US 11,817,415 B2
(45) Date of Patent: Nov. 14, 2023

(54) THERMAL BONDING SHEET AND THERMAL BONDING SHEET WITH DICING TAPE

(71) Applicant: NITTO DENKO CORPORATION, Ibaraki (JP)

(72) Inventors: Satoshi Honda, Ibaraki (JP); Yuki Sugo, Ibaraki (JP); Nao Kamakura, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 1311 days.

(21) Appl. No.: 16/308,931

(22) PCT Filed: May 23, 2017

(86) PCT No.: PCT/JP2017/019187
§ 371 (c)(1),
(2) Date: Dec. 11, 2018

(87) PCT Pub. No.: WO2017/221613
PCT Pub. Date: Dec. 28, 2017

(65) Prior Publication Data
US 2019/0148331 A1    May 16, 2019

(30) Foreign Application Priority Data

Jun. 24, 2016 (JP) ................................. 2016-125317
Mar. 10, 2017 (JP) ................................. 2017-046481

(51) Int. Cl.
C09J 1/00        (2006.01)
H01L 23/00    (2006.01)
(Continued)

(52) U.S. Cl.
CPC ................ H01L 24/32 (2013.01); C09J 1/00 (2013.01); C09J 7/10 (2018.01); C09J 7/385 (2018.01);
(Continued)

(58) Field of Classification Search
CPC ....... C09J 1/00; C09J 7/385; C09J 9/02; C09J 9/00; H01L 24/32; H01J 37/28
See application file for complete search history.

(56) References Cited

U.S. PATENT DOCUMENTS

2005/0253286 A1    11/2005    Yoshikawa et al.
2010/0065790 A1*   3/2010     Dietz ..................... H01L 24/29
                                                                        252/514
(Continued)

FOREIGN PATENT DOCUMENTS

CN    102712813 A    10/2012
CN    104641423 A    5/2015
(Continued)

OTHER PUBLICATIONS

European Patent Office, Extended European Search Report Issued in Application No. 17815082.7, dated May 2, 2019, Germany, 8 pages.
(Continued)

*Primary Examiner* — Antonio B Crite
(74) *Attorney, Agent, or Firm* — Alleman Hall Creasman & Tuttle LLP

(57) ABSTRACT

Provided are a thermal bonding sheet capable of suppressing inhibition of sintering of sinterable metallic particles by an organic component, thereby imparting sufficient bonding reliability to a power semiconductor device, and a thermal bonding sheet with a dicing tape having the thermal bonding sheet. A thermal bonding sheet has a precursor layer that is to become a sintered layer by heating, and the precursor layer includes sinterable metallic particles and an organic
(Continued)

component, the precursor layer has a phase separation structure that is a sea-island structure or a co-continuous structure, and in a SEM surface observation image on at least one surface of the precursor layer, a maximum value among each diameter of the largest inscribed circle for a region occupied by each phase of the phase separation structure is 1 μm or more and 50 μm or less.

7 Claims, 5 Drawing Sheets

(51) Int. Cl.
| | |
|---|---|
| C09J 7/10 | (2018.01) |
| C09J 7/38 | (2018.01) |
| C09J 9/02 | (2006.01) |
| C09J 11/04 | (2006.01) |
| H01J 37/28 | (2006.01) |
| H01L 21/52 | (2006.01) |
| H01L 21/683 | (2006.01) |
| H01L 21/78 | (2006.01) |
| C08K 3/08 | (2006.01) |
| C08K 3/10 | (2018.01) |
| C09J 9/00 | (2006.01) |

(52) U.S. Cl.
CPC . *C09J 9/00* (2013.01); *C09J 9/02* (2013.01); *C09J 11/04* (2013.01); *H01J 37/28* (2013.01); *H01L 21/52* (2013.01); *H01L 21/6836* (2013.01); *H01L 21/78* (2013.01); *H01L 24/27* (2013.01); *H01L 24/83* (2013.01); *C08K 3/08* (2013.01); *C08K 3/10* (2013.01); *C09J 2203/326* (2013.01); *C09J 2301/408* (2020.08); *C09J 2400/16* (2013.01); *H01L 2224/48091* (2013.01); *H01L 2224/73265* (2013.01); *H01L 2224/83191* (2013.01); *H01L 2224/83203* (2013.01); *H01L 2924/01029* (2013.01); *H01L 2924/01047* (2013.01); *H01L 2924/01079* (2013.01)

(56) References Cited

U.S. PATENT DOCUMENTS

| | | | |
|---|---|---|---|
| 2012/0296007 A1 | 11/2012 | Nakatani | |
| 2014/0231983 A1 | 8/2014 | Sugo et al. | |
| 2017/0152411 A1 | 6/2017 | Mihara et al. | |
| 2017/0369744 A1 | 12/2017 | Sugo et al. | |
| 2018/0223134 A1 * | 8/2018 | Imai | C09J 129/14 |
| 2018/0269175 A1 | 9/2018 | Sugo et al. | |
| 2018/0273808 A1 | 9/2018 | Kamakura et al. | |
| 2018/0277507 A1 | 9/2018 | Sugo et al. | |
| 2018/0346766 A1 * | 12/2018 | Mihara | C09J 163/00 |

FOREIGN PATENT DOCUMENTS

| | | | | |
|---|---|---|---|---|
| CN | 105473257 A | 4/2016 | | |
| CN | 108174617 A | 6/2018 | | |
| CN | 108174618 A | 6/2018 | | |
| CN | 108184331 A | 6/2018 | | |
| CN | 109070230 A | 12/2018 | | |
| EP | 3358605 A1 | 8/2018 | | |
| EP | 3358607 A1 | 8/2018 | | |
| EP | 3434398 A1 | 1/2019 | | |
| HK | 3239258 A1 | 11/2017 | | |
| JP | 2002020570 A | 1/2002 | | |
| JP | 2003249471 A | 9/2003 | | |
| JP | 2004250712 A | 9/2004 | | |
| JP | 2014503936 A | 2/2014 | | |
| JP | 2014055232 A | 3/2014 | | |
| JP | 2014111800 A | 6/2014 | | |
| JP | 5989928 B1 * | 9/2016 | | C08K 7/00 |
| KR | 102261617 B1 * | 6/2021 | | C09J 11/06 |
| KR | 102261617 B1 * | 6/2021 | | C09J 11/06 |
| TW | 200822990 A | 6/2008 | | |
| TW | 201437311 A | 10/2014 | | |
| TW | 201509869 A1 | 3/2015 | | |
| WO | 2008065728 A1 | 6/2008 | | |
| WO | 2012061511 A1 | 5/2012 | | |
| WO | 2012173187 A1 | 12/2012 | | |
| WO | 2014022284 A1 | 2/2014 | | |
| WO | 2015034579 A1 | 3/2015 | | |
| WO | 2016031551 A1 | 3/2016 | | |

OTHER PUBLICATIONS

Taiwan Intellectual Property Office, Decision of Rejection Issued in Application No. 106118152, dated May 17, 2021, 11 pages.
China National Intellectual Property Administration, Office Action and Search Report Issued in Application No. 201780038817.X, dated Apr. 20, 2021, 24 pages.
Taiwan Intellectual Property Office, Decision of Rejection Issued in Application No. 106118153, dated Mar. 25, 2021, 8 pages.
China National Intellectual Property Administration, Office Action and Search Report Issued in Application No. 201780038817.X, dated Jan. 18, 2022, 9 pages.
European Patent Office, Extended European Search Report Issued in Application No. 17815083.5, dated Jul. 23, 2019, Germany, 10 pages.
Japan Patent Office, Office Action Issued in Application No. 2016125322, dated Nov. 18, 2020, 6 pages.
Japan Patent Office, Office Action Issued in Application No. 2017046481, dated Jan. 14, 2021, 6 pages.
Taiwan Intellectual Property Office, Office Action and Search Report Issued in Application No. 106118152, dated Dec. 25, 2020, 13 pages.
Taiwan Intellectual Property Office, Office Action and Search Report Issued in Application No. 106118152, dated Sep. 29, 2020, 12 pages.
ISA Japan Patent Office, International Search Report Issued in Application No. PCT/JP2017/019191, dated Aug. 15, 2017, WIPO, 1 page.
ISA Japan Patent Office, International Search Report Issued in Application No. PCT/JP2017/019187, dated Aug. 15, 2017, WIPO, 1 page.
International Bureau of WIPO, International Preliminary Report on Patentablility Issued in Application No. PCT/JP2017/019187, dated Jan. 3, 2019, WIPO 5 pages.
Kagaku Daijiten, Publication 3, Tokyo, Jul. 1, 1963, p. 310-311, 5 pages.
Third party submission in Japanese corresponding application No. 2016-125322, dated Feb. 21, 2020, 27 pages.
Japan Patent Office, Office Action issued in Application No. 2016125322, dated Apr. 24, 2020, 8 pages.
China National Intellectual Property Administration, Office Action and Search Report Issued in Application No. 201780038817, dated Sep. 24, 2020, 26 pages.
Taiwan Intellectual Property Office, Office Action and Search Report Issued in Application No. 106118153, dated Sep. 14, 2020, 10 pages.
China National Intellectual Property Administration, Office Action and Search Report Issued in Application No. 201780039011.2, dated Jun. 20, 2022, 13 pages.
European Patent Office, Office Action Issued in Application No. 17815082.7, dated Sep. 1, 2022, Germany, 4 pages.
China National Intellectual Property Administration, Office Action and Search Report Issued in Application No. 2017800390112, dated Nov. 15, 2022, 10 pages.

* cited by examiner

THERMAL BONDING SHEET AND THERMAL BONDING SHEET WITH DICING TAPE

TECHNICAL FIELD

The present invention relates to a thermal bonding sheet and a thermal bonding sheet with dicing tape.

BACKGROUND ART

In production of semiconductor devices, the method of bonding a semiconductor element to an adherend such as a metallic lead frame (so-called bonding method) has been transited to methods by a solder and a resin paste from the conventional gold-silicon eutectic crystal that has been initially used. At present, a conductive resin paste is sometimes used.

However, in the method of using a conductive resin paste, deterioration in conductivity and nonuniformity in thickness of the paste due to generation of voids, and staining of the pad due to extrusion and the like can occur.

On the other hand, recently, power semiconductor devices that control or supply electric power have remarkably spread. A power semiconductor device has high calorific power because an electrical current usually flows through the device. Therefore, it is desired for a conductive adhesive that is used in a power semiconductor device to have high heat radiation property and low electric resistivity.

A power semiconductor device is required to operate at high speed with low loss. Conventionally, in a power semiconductor device, a semiconductor using Si such as IGBT (Insulated Gate Bipolar Transistor) or MOSFET (Metal-Oxide-Semiconductor Field-Effect Transistor) has been used. Recently, those using a semiconductor such as SiC or GaN have been developed and expected to extend in the future.

A semiconductor using SiC or GaN is featured by a large band gap and high dielectric breakdown electric field, and can work with low loss, at high speed and high temperature. Operation at high temperature is a merit in automobiles, small power converters and the like that operate in severe thermal environments. Since a semiconductor device having an application in a severe heat environment is assumed to operate at high temperature around 250° C., problems arise in heat characteristics and reliability with a solder or a conductive adhesive that is a conventional bonding/adhering material. In light of this, a paste material containing sintered metal particles has been proposed (see, Patent Document 1, for example). The paste material containing sintered metal particles contain nano-sized to micro-sized metal particles, and these metal particles melt at a temperature that is lower than the normal melting point due to the nano-size effect and sintering between particles progresses.

PRIOR ART DOCUMENTS

Patent Documents

Patent Document 1: JP-A-2014-111800

SUMMARY OF THE INVENTION

Problems to be Solved by the Invention

However, since the paste material containing sintered metal particles is in a paste state as literally shown, the thickness is nonuniform as is the case with a conductive resin paste, leading to bonding irregularity, and the bonding reliability especially at high temperatures can deteriorate. Therefore, in order to solve the nonuniformity of the thickness and the problems caused by the nonuniformity, a technique of making the bonding material containing the sinterable metallic particles into a sheet shape is being studied.

As one of measures to impart formability to the bonding material, it has been studied that an organic binder which is a relatively high molecular weight material is added. Sintering of the sheet-like bonding material proceeds through the process of decomposition and disappearance of the organic components such as the organic binder, followed by sintering of the sinterable metallic particles.

However, when a polymer material typified by an organic binder and metal fine particles coexist, the decomposition temperature of the polymer material shifts to a higher temperature side in some cases. If the degree of the high temperature shift of the decomposition temperature becomes strong, the decomposition temperature of the polymer material may be about the same as or higher than the sintering temperature of the sinterable metallic particles. In this case, the polymer material remains without disappearing even during sintering of the sinterable metallic particles, and the polymer material that has not been disappeared inhibits sintering of the sinterable metallic particles, and as a result, sintering of the sinterable metallic particles becomes insufficient, which may cause deterioration of the bonding reliability of the power semiconductor device.

The present invention has been made in view of the above problems, and it is an object of the present invention to provide a thermal bonding sheet capable of suppressing inhibition of sintering of sinterable metallic particles by an organic component, thereby imparting sufficient bonding reliability to a power semiconductor device, and a thermal bonding sheet with a dicing tape having the thermal bonding sheet.

Means for Solving the Problems

As a result of diligent efforts to solve the aforementioned conventional problems, the present inventors found that the problems can be solved by employing the following constitution and accomplished the present invention.

To be more specific, a thermal bonding sheet according to one embodiment of the present invention has a precursor layer that is to become a sintered layer by heating, and the precursor layer includes sinterable metallic particles and an organic component, the precursor layer has a phase separation structure that is a sea-island structure or a co-continuous structure, and in a SEM surface observation image on at least one surface of the precursor layer, a maximum value among each diameter of the largest inscribed circle for a region occupied by each phase of the phase separation structure is 1 μm or more and 50 μm or less.

In the precursor layer of the thermal bonding sheet, the sinterable metallic particles and the organic component have the sea-island structure or co-continuous structure to exhibit the phase separation structure where both are separated to two or more phases to each other. In the SEM surface observation image, when the largest inscribed circle in the region occupied by each phase is taken and the diameters of the respective largest inscribed circles are compared, the largest diameter is 1 μm or more and 50 μm or less. If each phase is finely dispersed or phase separated, the diameter of the largest inscribed circle for the region occupied by each phase also becomes small. On the other hand, if each phase gathers or aggregates and the degree of dispersion or phase separation becomes sparse, the diameter of the largest inscribed circle for the region occupied by each phase becomes large. That is, the maximum value (hereinafter also referred to as the "largest diameter") among the diameters of the largest inscribed circles obtained for the respective phases has the significance as an indicator representing the degree of dispersion or degree of aggregation of the phase separation structure in the precursor layer.

In the thermal bonding sheet, the largest diameter in the phase separation structure is within the above mentioned range, and the degree of aggregation (degree of gathering) of each phase is relatively high, in other words, the degree of phase separation is sparse. A moderate separation state is formed between a phase where the sinterable metallic particles are gathered and a phase where the organic components are gathered so that a shift of the decomposition temperature of the organic component to high temperature due to the coexistence of the organic component and the sinterable metallic particles can be suppressed to promote decomposition and disappearance of organic components. And, penetration of the phase of the organic component into the phase of the sinterable metallic particles is suppressed. As a result, inhibition of sintering of the sinterable metallic particles by the organic component can be prevented, and the bonding reliability of the power semiconductor device can be improved.

If the largest diameter is too small, the respective phases become finely dispersed, which leads to the shift of the decomposition temperature of the organic component to a high temperature and the inhibition of the sintering of the sinterable metallic particles due to the organic component, thereby lowering the bonding reliability. On the other hand, if the largest diameter is too large, the phase separation structure becomes too sparse and each component biasedly exists and there is a possibility that uniformity of characteristics of the thermal bonding sheet is impaired.

The organic component preferably includes a low molecular component having a weight average molecular weight of 1000 or less and a polymer component having a weight average molecular weight of 5000 or more, and a maximum value of an absolute value of a difference between a polarity term of a solubility parameter of the low molecular component and a polarity term of a solubility parameter of the polymer component is preferably 3 or more and 15 or less.

By setting the maximum value of the absolute value of the difference of the polarity terms within the above range, the polymer component and the low molecular component become difficult to dissolve each other, and a phase separation structure is exhibited between both components. Since the low molecular component is a liquid component in many cases compared to the polymer component and has high affinity with the sinterable metallic particles from the viewpoint of wettability and molecular mobility, many sinterable metallic particles tend to relatively stay in the phase of the low molecular weight component. That is, by utilizing the phase separation action between the polymer component and the low molecular component, it is possible to efficiently form the phase separation structure between the sinterable metallic particles and the polymer component. From a macroscopic point of view, it promotes the formation of a phase separation structure between the integral phase in which the phase of the sinterable metallic particles and the phase of the low molecular component are integrated, and the phase of the polymer component, it is possible to efficiently form a phase separation structure having a largest diameter in a specific range.

When the SEM surface observation image is binarized to make black and white display, an area ratio of a black part to the entire SEM surface observation image is preferably 10 to 80%, and when a SEM central part observation image at a central part of the precursor layer in its thickness direction is binarized to make black and white display, an area ratio of the black part to the entire SEM central part observation image is preferably 1 to 60%.

With this, it is possible to achieve both workability (flexibility and strength) of the thermal bonding sheet and good sintering bondability after sintering. If the area ratio of the black part when binarizing the SEM surface observation image is less than 10%, the flexibility of the thermal bonding sheet may be inferior in flexibility to deteriorate workability, and in the case of more than 80%, there is a fear that the sintering bondability may be inferior. When the area ratio of the black part when binarizing the SEM central part observation image is less than 1%, the strength (cohesive force) of the heat bonding sheet may be inferior, and when it is more than 60%, the number of pores increases in the sintered layer after sintering, and the strength of the sintered layer may be inferior.

The thermal bonding sheet is preferably used for heat bonding of a semiconductor chip and an adherend, at least a part of each surface of the semiconductor chip and the adherend preferably includes gold, silver or copper. Since the thermal bonding sheet has high bonding reliability, it can be suitably used for heat bonding between a semiconductor chip and an adherend such as a lead frame. In addition, since at least a part of each surface of the adherend and the chip includes gold, silver or copper, the affinity with the thermal bonding sheet and the bonding wire is enhanced and the bonding reliability with them can be further improved.

A thermal bonding sheet with dicing tape according to another embodiment includes:

a dicing tape, and the thermal bonding sheet laminated on the dicing tape.

Since the thermal bonding sheet with dicing tape has a structure that a dicing tape and the thermal bonding sheet are integrated, a step for laminating the thermal bonding sheet with the dicing tape can be omitted. Since the thermal bonding sheet is provided, sintering of the sinterable metallic particles can proceed at an enough level, resulting in good bonding reliability.

MODE FOR CARRYING OUT THE INVENTION

Hereinafter, embodiments of the thermal bonding sheet and the thermal bonding sheet with dicing tape of the present invention are described by referring to attached drawings. In part or whole of drawings, the part that is unnecessary for description is omitted, and some part is shown while it is scaled up or down for facilitating the description. The term indicating the positional relationship, such as up or down is merely used for facilitating the description and is not intended to limit the constitution of the present invention.

(Thermal Bonding Sheet with Dicing Tape)

Figure 1:
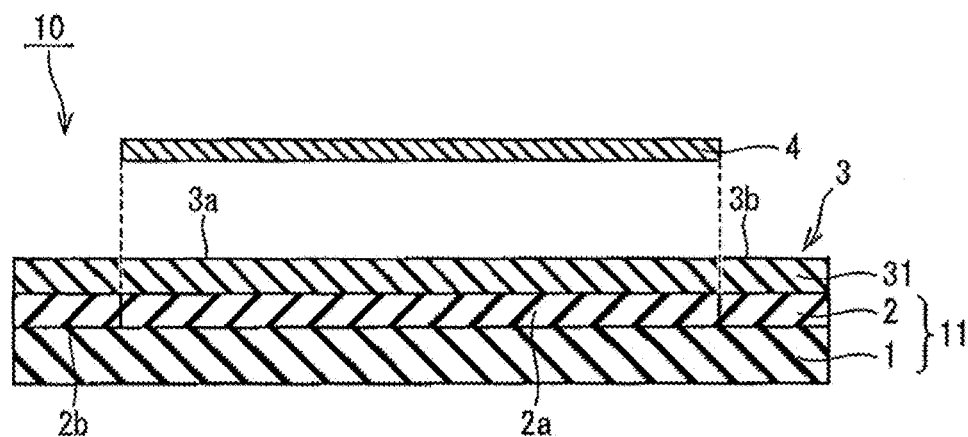
FIG. 1 is a cross-sectional schematic view showing a thermal bonding sheet with dicing tape according to one embodiment of the present invention.
Figure 2:
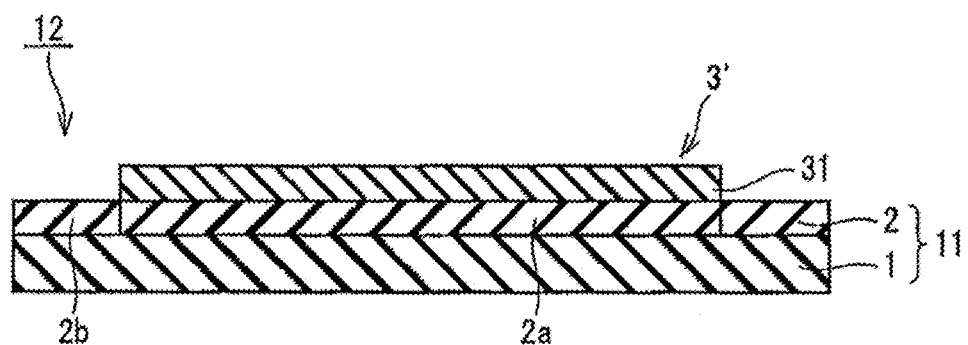
FIG. 2 is a cross-sectional schematic view showing a thermal bonding sheet with dicing tape according to other embodiment of the present invention.

One exemplary thermal bonding sheet according to the present embodiment is in a state that the dicing tape is not bonded in the thermal bonding sheet with dicing tape as will be described below. Therefore, in the following, description is made for the thermal bonding sheet with dicing tape, and the thermal bonding sheet will be described in the description. FIG. 1 is a cross-sectional schematic view showing a thermal bonding sheet with dicing tape according to one embodiment of the present invention. FIG. 2 is a cross-sectional schematic view showing other thermal bonding sheet with dicing tape according to other embodiment of the present invention.

As shown in FIG. 1, a thermal bonding sheet with dicing tape 10 has such a structure that a thermal bonding sheet 3 is laminated on a dicing tape 11. The dicing tape 11 is structured by laminating a pressure-sensitive adhesive layer 2 on a base material 1, and the thermal bonding sheet 3 is disposed on the pressure-sensitive adhesive layer 2. Also, the thermal bonding sheet with dicing tape of the present invention may have such a structure that a thermal bonding sheet 3' is formed only in a work attaching part as in a thermal bonding sheet with dicing tape 12 shown in FIG. 2.

(Thermal Bonding Sheet)

The thermal bonding sheet 3, 3' is in a sheet form. The sheet form rather than the paste form can provide excellent thickness uniformity and handleability.

The thermal bonding sheet 3, 3' according to the present embodiment includes a precursor layer 31 that is to become a sintered layer by heating. In the present embodiment, description is made for the case where the thermal bonding sheet contains only one layer of a precursor layer that is to become a sintered layer by heating, however, the present invention is not limited to this case. The precursor layer that is to become a sintered layer by heating may have such a structure that a plurality of precursor layers are laminated.

Also, in the present embodiment, description is made for the case where the thermal bonding sheet includes a precursor layer that is to become a sintered layer by heating, however, the present invention is not limited to this case. The thermal bonding sheet of the present invention may include two or more layers. For example, the thermal bonding sheet may have such a structure that a precursor layer that is to become a sintered layer by heating, and other layer (layer that is not to become a sintered layer by heating) are laminated.

That is, it is only required that the thermal bonding sheet according to the present invention has at least a precursor layer that is to become a sintered layer by heating, and other constitution is not particularly limited.

(Precursor Layer that is to Become Sintered Layer by Heating)

Figure 3A:
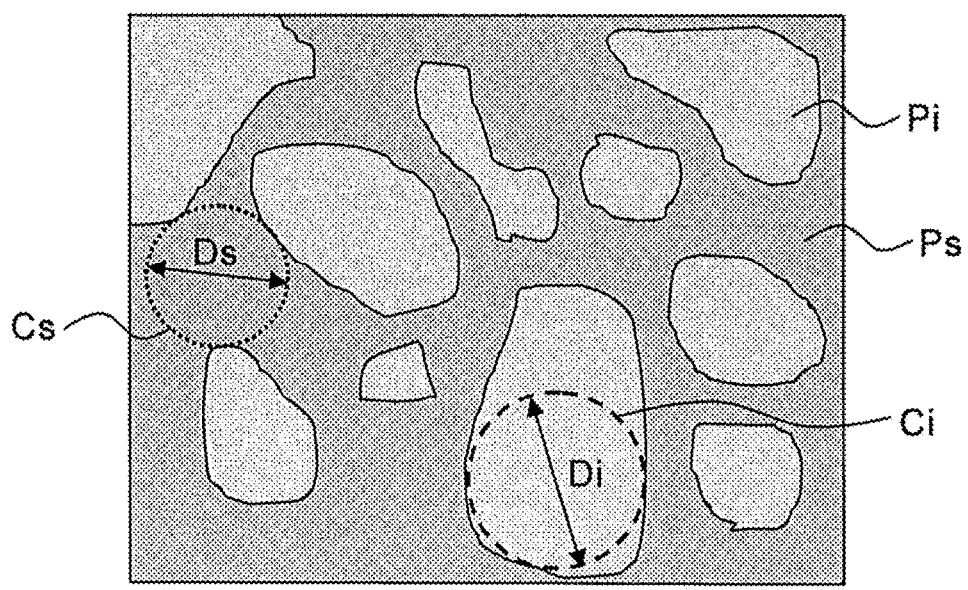
FIG. 3A is a schematic view showing a phase separation structure in a precursor layer of a thermal bonding sheet according to one embodiment of the present invention.
Figure 3B:
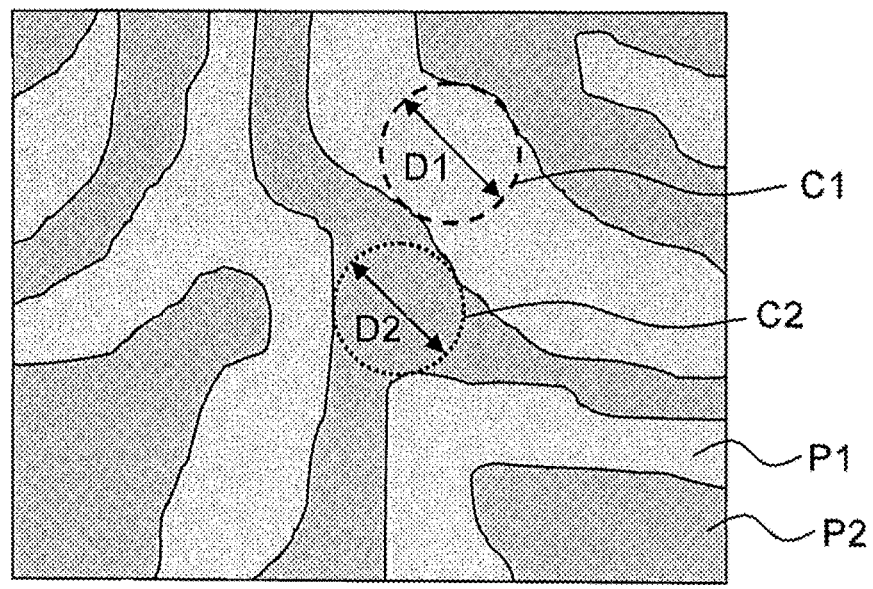
FIG. 3B is a schematic view showing a phase separation structure in a precursor layer of a thermal bonding sheet according to other embodiment of the present invention.

The precursor layer 31 that is to become a sintered layer by heating (hereinafter, also simply referred to as "precursor layer 31") includes sinterable metallic particles and an organic component (each component will be described in detail later.). As shown in FIGS. 3A and 3B, the precursor layer 31 has a phase separation structure on at least one surface due to phase separation between the sinterable metallic particles and the organic component. In FIG. 3A, the phase separation structure is a sea-island structure, and in FIG. 3B, the phase separation structure is a co-continuous structure. The phase separation structure may be either a sea-island structure or a co-continuous structure, and the sea-island structure and the co-continuous structure may coexist.

The sea-island structure shown in FIG. 3A, it is separated into two phases, the phase of the sea (for example, the phase of the organic component) Ps and the phase of the island (for example, the phase of the sinterable metallic particle) Pi. However, the number of phases included in the phase separation structure is not limited to 2, and the phase separation structure may be separated into three or more phases depending on the components and the like contained in the precursor layer 31. In addition, it is not limited to the case that the phase of the sea and the phase of the island are the phase of the organic component and the phase of the sinterable metallic particles, respectively. The phase of the sea and the islands may be the phase of the sinterable metallic particles and the phase of the organic component, respectively, depending on the components contained in the precursor layer 31 and their compounding ratios.

In the co-continuous structure shown in FIG. 3B, unlike the sea-island structure shown in FIG. 3A, they are separated into two phases, a first phase P1 and a second phase P2, which are continuous to a certain extent. However, even in a co-continuous structure, the number of phases contained in the phase separation structure is not limited to 2, but the phase separation structure may be separated into three or more phases depending on the components and the like contained in the precursor layer 31. Also, the first phase and the second phase may be either a phase of a sinterable metallic particle or a phase of an organic component, respectively.

In the SEM surface observation image of at least one surface of the precursor layer 31, the maximum value among the diameters of the largest inscribed circles of the regions occupied by the phases of the phase separation structure is 1 μm or more and 50 μm or less. This feature will be described below.

When FIG. 3A is seen as a schematic diagram of the SEM surface observation image of at least one surface of the precursor layer 31, in the sea-island structure shown in FIG. 3A, the regions occupied by the phase Pi of the island are scattered in the region occupied by the phase Ps of the sea. With regard to the area occupied by the phase Pi of the island in the observation visual field, when inscribed circles (for example, when looking at a region occupied by one island, the largest area circle among the circles contacting the boundary line between the phase of the island and the phase of the sea) are obtained for each island and the inscribed circle having the largest diameter among these inscribed circles is set as the largest inscribed circle Ci for the region occupied by the phase Pi of the island. Similarly, in the observation visual field of view, with regard to the area occupied by the phase Ps of the sea, inscribed circles (for example, the largest area circle among the circles in contact with the boundary line between a region of a certain local sea phase and a region of a phase of the island) are obtained for each local area, and the inscribed circle having the largest diameter among the plurality of inscribed circles is set as the largest inscribed circle Cs for the area occupied by the sea phase Ps. Then, the diameter Di of the largest inscribed circle Ci for the region occupied by the phase Pi of the island is compared with the diameter Ds of the largest inscribed circle Cs for the region occupied by the sea phase Ps, and the maximum value (that is, Diameter Di) is the largest diameter. Even if there are three or more phases in the phase separation structure, it is possible to obtain the largest diameter by obtaining the diameter of the largest inscribed circle for each phase in the same manner as above and obtaining the maximum value among the diameters.

In the co-continuous structure shown in FIG. 3B, the largest diameter can be obtained similarly to the embodiment shown in FIG. 3A. In the co-continuous structure shown in FIG. 3B, the region occupied by the first phase P1 and the region occupied by the second phase P2 coexist. In the observation visual field of view, with regard to a region occupied by the first phase P1, inscribed circles (for example, in the case of one consecutive region of the regions occupied by the first phase P1, the largest area circle among the circles contacting the boundary line between the phase and the second phase) are obtained for each continuous region, and the inscribed circle having the largest diameter among the plurality of inscribed circles is determined as the largest inscribed circle C1 for the region occupied by the first phase P1. Similarly, in the observation visual field of view, with regard to the region occupied by the second phase P2, inscribed circles (for example, in the case of one continuous region in the regions occupied by the second phase P2, the largest area circle among circles contacting the boundary line between the phase and the first phase) are obtained for each continuous region and the inscribed circle having the largest diameter among the plurality of inscribed circles is determined as the largest inscribed circle C2 for the region occupied by the second phase P2. Then, the diameter D1 of the largest inscribed circle C1 for the region occupied by the first phase P1 is compared with the diameter D2 of the largest inscribed circle C2 for the region occupied by the second phase P2, and the maximum value (that is, the diameter D1) is the largest diameter. Even if there are three or more continuous phases in the phase separation structure, the diameter of the largest inscribed circle is obtained for each continuous phase in the same manner as above, and the largest diameter among the diameters can be obtained to obtain the largest diameter.

In the present embodiment, the largest diameter is 1 μm or more and 50 μm or less, preferably 1.5 μm or more and 30 μm or less, more preferably 2 μm or more and 10 μm or less. By setting the largest diameter of the phase separation structure observed in the precursor layer 31 within the above range, the degree of aggregation (degree of gathering) of each phase is made relatively high, and an adequate separation state is formed between the phase where the sinterable metallic particles gather and the organic component, a high temperature shift of the decomposition temperature of the organic component due to the coexistence of the organic component and the sinterable metallic particles can be suppressed to promote the decomposition and disappearance of the organic component. In addition, penetration of the phase of the organic component into the phase of the sinterable metallic particles is suppressed, inhibition of sintering of the sinterable metallic particles by the organic component can be prevented, and the bonding reliability of the power semiconductor device can be improved.

The precursor layer 31 has an average thickness of 5 μm to 200 μm, preferably 10 μm to 150 μm, more preferably 15 μm to 100 μm. By setting the average thickness of the precursor layer 31 before heating within the above range, it is possible to maintain the sheet form and secure the thickness uniformity.

The precursor layer 31 has a tensile modulus obtained by the following tensile testing method of preferably 10 MPa to 3000 MPa, more preferably 12 MPa to 2900 MPa, further preferably 15 MPa to 2500 MPa.

Tensile testing method:
(1) As a test sample, a thermal bonding sheet (thermal bonding sheet for tensile test) having a thickness of 200 μm, a width of 10 mm, and a length of 40 mm is prepared,
(2) a tensile test is conducted with a distance between chucks of 10 mm, a tensile speed of 50 mm/min, at 23° C., and
(3) the inclination of the linear part of the obtained stress-strain chart is determined as a tensile modulus.

When the tensile modulus of the precursor layer 31 is 10 MPa or more, it is possible to further prevent the material forming the thermal bonding sheet from protruding or climbing up on the chip surface at the time of die attachment. When the tensile modulus is 3000 MPa or less, it is possible to fix the semiconductor wafer, for example, at the time of dicing.

The precursor layer 31 has a carbon concentration obtained by the energy dispersive X-ray analysis after temperature rise from 23° C. to 400° C. at a heating rate of 10° C./min under a nitrogen atmosphere of preferably 15% by weight or less, more preferably 12% by weight or less, further preferably 10% by weight or less. When the carbon concentration is 15% by weight or less, almost no organic matter exists in the precursor layer 31 after temperature rise to 400° C. As a result, after the thermal bonding step, excellent heat resistance, and high reliability and heat characteristics even in high temperature environment are achieved.

(Sinterable Metallic Particles)

As the sinterable metallic particles, an aggregate of metallic particles can be favorably used. Examples of the metallic fine particles include fine particles of metal. Examples of the metal include gold, silver, copper, silver oxide, and copper oxide. Among these, at least one selected from the group consisting of silver, copper, silver oxide, and copper oxide is preferred. When the metallic fine particles are at least one selected from the group consisting of silver, copper, silver oxide and copper oxide, the thermal bonding can be achieved more favorably.

The average particle size of the sinterable metallic particles is preferably 0.0005 μm or more, more preferably 0.001 μm or more. Examples of the lower limit of the average particle size include 0.01 μm, 0.05 μm, and 0.1 μm. On the other hand, the average particle size of the sinterable metallic particles is preferably 30 μm or less, more preferably 25 μm or less. Examples of the upper limit of the average particle size include 20 μm, 15 μm, 10 μm, and 5 μm.

The average particle size of the sinterable metallic particles is determined in the following method. To be more specific, the sinterable metallic particles are observed by SEM (scanning electron microscope) and an average particle size is determined. The SEM observation is preferably conducted with a 5000-fold magnification for the sinterable metallic particles of micro size, and with a 50000-fold magnification for the submicron-sized sinterable metallic particles, and with a 300000-fold magnification for the nano-sized sinterable metallic particles.

The shape of the sinterable metallic particles is not particularly limited, and is, for example, globular, bar-like, scaly, or indefinite.

The precursor layer 31 preferably includes sinterable metallic particles in the range of 60 to 98% by weight with respect to the entire precursor layer 31. The content of the sinterable metallic particles is more preferably in the range of 65 to 97% by weight, and further preferably in the range of 70 to 95% by weight. When sinterable metallic particles are contained in the range of 60 to 98% by weight, sinterable metallic particles can be sintered or melt to bond two objects (for example, a semiconductor chip and a lead frame).

(Organic Component)

The organic component preferably includes a low molecular component having a weight average molecular weight of 1000 or less. A low-boiling-point binder is preferably included as the low molecular component. The low-boiling-point binder is used for facilitating the handling of the metallic fine particles. Concretely, it can be used as a metallic fine particles-containing paste in which the metallic fine particles are dispersed in the low-boiling-point binder. Additionally, it is preferred to contain the low-boiling-point binder also for adjusting the precursor layer of the sintered layer to have a desired mechanical property.

Concrete examples of the low-boiling-point binder include monohydric or polyhydric alcohols such as pentanol, hexanol, heptanol, octanol, 1-decanol, ethylene glycol, diethylene glycol, propylene glycol, butylene glycol, α-terpineol, 1,6-hexanediol, and isobornyl cyclohexanol (MTPH), ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butylmethyl ether, diethylene glycol isopropylmethyl ether, triethylene glycol dimethyl ether, triethylene glycol butylmethyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether, ethylene glycol ethyl ether acetate, ethylene glycol butyl ether acetate, diethylene glycol ethyl ether acetate, diethylene glycol butyl ether acetate, and dipropylene glycol methyl ether acetate (DPMA). Combinations of two or more of these may be used. Among these, a combination of two of these having different boiling-point points is preferably used. Use of a combination of two of these having different boiling-point points results in excellent retention of the sheet form.

The organic component preferably includes a polymer component having a weight average molecular weight of 5000 or more. A thermally decomposable binder is preferably included as the polymer component. When the thermally decomposable binder is contained, the sheet form is easy to be maintained before the thermal bonding step. Also, it is easy to be thermally decomposed in the thermal bonding step.

In the present description, "thermally decomposable binder" means a binder that can be thermally decomposed in the thermal bonding step. It is preferred that the thermally decomposable binder little remains in the sintered layer (precursor layer 31 after heating) after the thermal bonding step. Examples of the thermally decomposable binder include materials having a carbon concentration obtained by the energy dispersive X-ray analysis after temperature rise from 23° C. to 400° C. at a temperature rising speed of 10° C./min under a nitrogen atmosphere of preferably 15% by weight or less even when it is contained in the precursor layer 31. For example, by employing a material that is easier to thermally decompose as the thermally decomposable binder, it is possible to make the thermally decomposable binder little remain in the sintered layer (precursor layer 31 after heating) after the thermal bonding step even if the content of the thermally decomposable binder is relatively large.

Examples of the thermally decomposable binder include polycarbonate, acryl resin, ethyl cellulose, and polyvinyl alcohol. These materials can be used solely or in combination of two or more. Among these, polycarbonate is preferred from the view point of high thermal decomposability.

While the polycarbonate is not particularly limited as far as it can thermally decompose in the thermal bonding step, examples of the polycarbonate include aliphatic polycarbonates that do not contain an aromatic compound (for example, benzene ring) between carbonate ester groups (—O—CO—O—) of the main chain, and are composed of an aliphatic chain, and aromatic polycarbonates that contain an aromatic compound between carbonate ester groups (—O—CO—O—) of the main chain. Among these, aliphatic polycarbonates are preferred.

Examples of the aliphatic polycarbonates include polyethylene carbonate, and polypropylene carbonate. Among these, polypropylene carbonate is preferred from the view point of solubility in an organic solvent in preparation of vanish for forming a sheet.

Examples of the organic polycarbonate include those containing a bisphenol A structure in the main chain.

The polycarbonate has a weight average molecular weight of preferably in the range of 10,000 to 1,000,000.

In the description, the weight average molecular weight is a value obtained by measuring by GPC (gel permeation chromatography, HLC-8320 GPC manufactured by TOSOH) and calculating with polystyrene conversion. The measurement conditions are as follows. Column: TSK gel Super HZM-H/HZ4000/HZ3000/HZ2000, Column size: 6.0 mm inner diameter×150 mm, solvent: tetrahydrofuran (THF), solution concentration: 0.03-0.1 wt %, flow rate: 0.6 mL/min, detector: differential refractometer (RI), column temperature: 40° C., injection amount: 20 μL.

Examples of the acryl resin include polymers (acryl copolymers) composed of one or two or more esters of acrylic acid or methacrylic acid having a straight-chain or branched alkyl group having 30 or less carbons, particularly 4 to 18 carbons as far as they can thermally decompose in the thermal bonding step. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, a undecyl group, a lauryl group, a tridecyl group, a tetradecyl group, a stearyl group, an octadecyl group, or a dodecyl group.

Examples of other monomer that forms a polymer (acryl copolymer) include, but are not limited to, carboxyl group-containing monomers such as acrylic acid, methacrylic acid, carboxyethyl acrylate, carboxypentyl acrylate, itaconic acid, maleic acid, fumaric acid or crotonic acid, acid anhydride monomers such as maleic anhydride or itaconic anhydride, hydroxyl group-containing monomers such as (meth)acrylate 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate or (4-hydroxymethylcyclohexyl)-methylacrylate, sulfonic group-containing monomers such as styrenesulfonic acid, allylsulfonic acid, 2-(meth)acrylamide-2-methylpropanesulfonic acid, (meth)acrylamide propanesulfonic acid, sulfopropyl (meth)acrylate or (meth)acryloyloxynaphthalenesulfonic acid, or phosphoric group-containing monomers such as 2-hydroxyethylacryloylphosphate.

Among the acryl resins, those having a weight average molecular weight of 10000 to 1000000 are more preferred, and those having a weight average molecular weight of 30000 to 700000 are further preferred. This is because those satisfying the numerical ranges described above are excellent in adhesion before the thermal bonding step, and in thermal decomposition during the thermal bonding step. The weight average molecular weight is a value that is measured by GPC (gel permeation chromatography) and calculated by conversion by polystyrene.

Among the acryl resin, acryl resins that thermally decompose at 200° C. to 400° C. are preferred.

A maximum value of an absolute value of a difference between a polarity term of a solubility parameter of the low molecular component and a polarity term of a solubility parameter of the polymer component is preferably 3 or more and 15 or less, and more preferably 5 or more and 12 or less. In the case where one low molecular component and one polymer component exist respectively, the absolute value of the difference between the polarity terms of their solubility parameters becomes the maximum value as it is. In the case of containing plural kinds of low molecular components or plural kinds of polymer components, there are combinations of differences in polarity terms by the product of the number of kinds of low molecular components and the number of kinds of polymer components, therefore, the maximum value among the absolute values of the differences is preferably within the above range. By setting the maximum value of the absolute value of the difference of the polarity terms within the above range, the polymer component and the low molecular component become difficult to dissolve each other, and formation of the phase separation structure is promoted between both components. Since the low molecular component is a liquid component in many cases compared to the polymer component and has high affinity with the sinterable metallic particles from the viewpoint of wettability and molecular mobility, many sinterable metallic particles tend to relatively stay in the phase of the low molecular weight component. That is, by utilizing the phase separation action between the polymer component and the low molecular component, it is possible to efficiently form the phase separation structure between the sinterable metallic particles and the polymer component. From a macroscopic point of view, it promotes the formation of a phase separation structure between the integral phase in which the phase of the sinterable metallic particles and the phase of the low molecular component are integrated, and the phase of the polymer component, it is possible to efficiently form a phase separation structure having a largest diameter in a specific range.

When the SEM surface observation image is binarized to make black and white display, an area ratio of a black part to the entire SEM surface observation image is preferably 10 to 80%, and more preferably 15 to 70%. And, when a SEM central part observation image at a central part of the precursor layer in its thickness direction is binarized to make black and white display, an area ratio of the black part to the entire SEM central part observation image is preferably 1 to 60%, and more preferably 5 to 50%. The measurement method of the area ratio of each black portion when binarizing the SEM surface observation image and the SEM central part observation image is as described in Examples. For example, when a low molecular component and a polymer component having the above solubility parameter relationship are included as an organic component, the integral phase in which the phase of the sinterable metallic particles and the phase of the low molecular component are united is displayed as a white part, and the phase of the polymer component is displayed as a black part. By setting the area ratio of each black part (the phase of the polymer component in the above case) when binarizing the SEM surface observation image and the SEM central part observation image to the above range, it is possible to achieve both workability (flexibility and strength) of the thermal bonding sheet and good sintering bondability after sintering.

The precursor layer 31 may contain, for example, a plasticizer as appropriate.

The thermal bonding sheets 3, 3' can be produced in an ordinary method. For example, a vanish containing aforementioned components for forming the precursor layer 31 is prepared, and the vanish is applied on a base separator to have a predetermined thickness to form an applied film, and then the applied film is dried to produce the thermal bonding sheets 3, 3'.

Preferred examples of the solvent used for the vanish include, but are not limited to, organic solvents and alcohol solvents capable of uniformly dissolving, kneading or dispersing the components. Examples of the organic solvents include ketone-based solvents such as dimethylformamide, dimethylacetamide, N-methylpyrrolidone, acetone, methylethylketone and cyclohexanone, toluene, and xylene. Examples of the alcohol solvents include ethylene glycol, diethylene glycol, 1,2-propanediol, 1,3-propanediol, 1,2-butanediol, 1,3-butanediol, 1,4-butanediol, 2-butene-1,4-diol, 1,2,6-hexanetriol, glycerin, octanediol, 2-methyl-2,4-pentanediol, and terpineol.

The applying method is not particularly limited. Examples of the method for applying a solvent include a die coater, a gravure coater, a roll coater, a reverse coater, a comma coater, a pipe doctor coater, and screen printing. Among these, a die coater is preferred from the view point of high uniformity of application thickness. The drying condition of the applied film is not particularly limited, and for example, the applied film can be dried, for example, at a drying temperature of 70 to 160° C. for a drying time of 1 to 5 minutes. Even after drying the applied film, the solvent fails to entirely vaporize and remains in the coating film depending on the solvent.

When the precursor layer 31 contains the low-boiling-point binder, the low-boiling binder-point can partly volatilize depending on the drying condition. Therefore, the ratio of the components constituting the precursor layer 31 varies depending on the drying condition. For example, for the precursor layer 31 that is formed of the same vanish, the higher the drying temperature, and the longer the drying time, the larger the content of the metallic fine particles in the entire precursor layer 31 and the content of the thermally decomposable binder become. Therefore, it is preferred to set the drying condition so that the contents of the metallic fine particles and the thermally decomposable binder in the precursor layer 31 are desired amounts.

As the base separator, a plastic film or paper having a surface coated with a release agent such as polyethylene terephthalate (PET), polyethylene, polypropylene, a fluorine-based release agent, a long-chain alkyl acrylate-based release agent can be used.

As the manufacturing method of the thermal bonding sheet 3, 3', for example, a method of mixing the components, and press-molding the obtained mixture to produce the thermal bonding sheet 3, 3' is also preferred. Examples of the mixer include a planetary mixer.

(Dicing Tape)

The dicing tape 11 is formed by laminating the pressure-sensitive adhesive layer 2 on the base material 1.

The base material 1 is a base for the strength of the thermal bonding sheet with dicing tape 10, 12, and is preferably ultraviolet transmissive. Examples of the base material 1 include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene(meth)acrylic acid copolymer; an ethylene(meth)acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyetherimide; polyamide; whole aromatic polyamides; polyphenylsulfide; aramid (paper); glass; glass cloth; a fluorine resin; polyvinyl chloride; polyvinylidene chloride; a cellulose resin; a silicone resin; metal (foil); and paper.

Further, the material of the base material 1 includes a polymer such as a cross-linked body of the above resins. The above plastic film may be also used as unstreched, or may be also used on which a monoaxial or a biaxial stretching treatment is performed depending on necessity. According to resin sheets in which heat shrinkable properties are given by the stretching treatment, etc., the adhesive area of the pressure sensitive adhesive layer 2 and the thermal bonding sheet 3, 3' is reduced by thermally shrinking the base material 1 after dicing, and the recovery of the semiconductor chips can be facilitated.

A known surface treatment such as a chemical or physical treatment such as a chromate treatment, ozone exposure, flame exposure, high voltage electric exposure, and an ionized radiation treatment, and a coating treatment by an undercoating agent (for example, a tacky substance described later) can be performed on the surface of the base material 1 in order to improve adhesiveness, holding properties, etc. with the adjacent layer.

The thickness of the base material 1 can be appropriately decided without limitation particularly. However, it is generally about 5 to 200 μm.

Examples of the pressure-sensitive adhesive layer 2 include, but are not limited to, common pressure-sensitive adhesives such as an acryl-based pressure-sensitive adhesive or a rubber-based pressure-sensitive adhesive. An acrylic pressure-sensitive adhesive having an acrylic polymer as a base polymer is preferable as the pressure-sensitive adhesive from the point of view of clean washing properties of an electric part such as a semiconductor wafer and glass that dislike contamination with ultra pure water and an organic solvent such as alcohol.

Examples of the acrylic polymer include acrylic polymers each comprising, as one or more monomer components, one or more selected from alkyl esters of (meth)acrylic acid (for example, linear and branched alkyl esters thereof each having an alkyl group having 1 to 30 carbon atoms, in particular, 4 to 18 carbon atoms, such as methyl ester, ethyl ester, propyl ester, isopropyl ester, butyl ester, isobutyl ester, s-butyl ester, t-butyl ester, pentyl ester, isopentyl ester, hexyl ester, heptyl ester, octyl ester, 2-ethylhexyl ester, isooctyl ester, nonyl ester, decyl ester, isodecyl ester, undecyl ester, dodecyl ester, tridecyl ester, tetradecyl ester, hexadecyl ester, octadecyl ester, and eicosyl ester thereof) and cycloalkyl esters of (meth)acrylic acid (for example, cyclopentyl ester and cyclohexyl ester thereof). The wording "esters of (meth) acrylic acid" means esters of acrylic acid and/or methacrylic acid. All of the words including "(meth)" in connection with the present invention have an equivalent meaning.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl (meth)acrylate, carboxypentyl (meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl (meth) acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxylmethylcyclohexyl)methyl (meth)acrylate; sulfonic acid group containing monomers such as styrenesulfonic acid, allylsulfonic acid, 2-(meth) acrylamide-2-methylpropanesulfonic acid, (meth) acrylamidepropanesulfonic acid, sulfopropyl (meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer(s) to be used is preferably 40% or less by weight of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth) acrylate, trimethylol propane tri(meth)acrylate, pentaerythritol tri(meth)acrylate, dipentaerythritol hexa(meth)acrylate, epoxy (meth)acrylate, polyester (meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

The acrylic polymer can be obtained by polymerizing a single monomer or a mixture of monomers of two types or more. The polymerization can be performed with any of polymerization methods such as solution polymerization, emulsification polymerization, bulk polymerization, and suspension polymerization. The content of a low molecular weight material is preferably small from the point of view of prevention of contamination to a clean adherend. In this respect, the number average molecular weight of the acrylic polymer is preferably about 100,000 or more, and more preferably about 200,000 to 3,000,000, and especially preferably about 300,000 to 1,000,000.

Further, an external crosslinking agent can be suitably adopted to the pressure-sensitive adhesive in order to increase the number average molecular weight of an acrylic polymer that is a base polymer, etc. Specific examples of the external crosslinking method include methods of reacting by adding a so-called crosslinking agents such as a polyisocyanate compound, an epoxy compound, an aziridine compound, and a melamine based crosslinking agent. When the external crosslinking agent is used, the amount to be used can be suitably determined by the balance with the base polymer that is to be crosslinked and by the purpose of use as a pressure-sensitive adhesive. In general, it is preferably mixed at about 5 parts by weight or less, and more preferably 0.1 to 5 parts by weight to 100 parts by weight of the base polymer. Besides the above-described components, an additive such as conventionally known various tackifiers and antioxidants may be used in the pressure-sensitive adhesive depending on necessity.

The pressure sensitive adhesive layer 2 is constituted by containing a radiation curable pressure sensitive adhesive. The radiation curable pressure sensitive adhesive can easily decrease its adhesive strength by increasing the degree of crosslinking by irradiation with radiation such as ultraviolet-ray. By radiating only a part 2a corresponding to the work attaching part of the pressure sensitive adhesive layer 2 shown in FIG. 2, a difference of the adhesive strength to another part 2b can be also provided.

Also, by curing the radiation curable pressure-sensitive adhesive layer 2 together with the thermal bonding sheet 3' shown in FIG. 2, the part 2a where the adhesive strength is significantly reduced can be easily formed. Since the thermal bonding sheet 3' is attached to the part 2a that has been cured and has reduced adhesive strength, the boundary in the pressure-sensitive adhesive layer 2 between the part 2a and the thermal bonding sheet 3' has the property of easily peeling off at the time of pickup. On the other hand, the part that has not been irradiated with radiation has sufficient adhesive strength, and forms the part 2b. Irradiation of the pressure-sensitive adhesive layer can be conducted after dicing and before pickup.

As described above, in the pressure-sensitive adhesive layer 2 of the thermal bonding sheet with dicing tape 10 shown in FIG. 1, the part 2b formed of the uncured radiation curable pressure-sensitive adhesive adheres to the thermal bonding sheet 3, and the holding force at the time of dicing can be secured. In such a way, the radiation curable pressure-sensitive adhesive can support the thermal bonding sheet 3 for fixing the chip-like work (e.g., semiconductor chip) onto an adherend such as a substrate with good balance of adhesion and peeling. In the pressure-sensitive adhesive layer 2 of the thermal bonding sheet with dicing tape 11 shown in FIG. 2, the part 2b can fix the wafer ring.

A radiation curable pressure-sensitive adhesive having a radiation curable functional group such as a carbon-carbon double bond and having adherability can be used without special limitation. Example of the radiation curable pressure-sensitive adhesive include an additive-type radiation curable pressure-sensitive adhesive in which a radiation curable monomer component or oligomer component is mixed into a general pressure-sensitive adhesive such as an acrylic pressure-sensitive adhesive or a rubber-based pressure-sensitive adhesive.

The radiation-curing monomer component to be compounded includes, for example, urethane oligomer, urethane (meth)acrylate, trimethylol propane tri(meth)acrylate, tetramethylol methane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butane diol di(meth)acrylate, tetraethylene glycol di(meth)acrylate, 1,6-hexane diol (meth)acrylate, neopentyl glycol di(meth)acrylate etc.; ester acrylate oligomers; and isocyanurates or isocyanurate compounds such as 2-propenyl-3-butenyl cyanurate, tris(2-methacryloxyethyl) isocyanurate etc. The radiation-curing oligomer component includes various acrylate oligomers such as those based on urethane, polyether, polyester, polycarbonate, polybutadiene etc., and their molecular weight is preferably in the range of about 100 to 30000. For the compounded amount of the radiation-curable monomer component or oligomer component, the amount of which the adhesive strength of the pressure-sensitive adhesive layer can be decreased can be determined appropriately depending on the type of the above-described pressure-sensitive adhesive layer. In general, the compounded amount is, for example, 5 to 500 parts by weight, and preferably about 40 to 150 parts by weight relative to 100 parts by weight of the base polymer such as an acrylic polymer constituting the pressure-sensitive adhesive.

Besides the additive-type radiation curable pressure-sensitive adhesive that is explained above, examples of the radiation curable pressure-sensitive adhesive include an internal radiation curable pressure-sensitive adhesive in which a polymer having a carbon-carbon double bond in the polymer side chain, in the main chain, or in the ends of the main chain is used as the base polymer. The internal radiation curable pressure-sensitive adhesive does not have to contain an oligomer component that is a low molecular component, etc., or it does not contain much of the component. Therefore, it is preferable because a pressure-sensitive adhesive layer having a stable layer structure can be formed without the oligomer component, etc. shifting in the pressure-sensitive adhesive with the passage of time.

A base polymer having a carbon-carbon double bond and having adherability can be used without limitation. As such base polymer, a polymer having an acrylic polymer as a basic skeleton is preferable. Examples of the basic skeleton of the acrylic polymer include the acrylic polymers shown above.

A method of introducing a carbon-carbon double bond into the acrylic polymer is not especially limited, and various methods can be adopted. However, a molecular design is easy when the carbon-carbon double bond is introduced in the polymer side chain. For example, a method of copolymerizing a monomer having a functional group with an acrylic polymer and then performing condensation or an addition reaction on a compound having a functional group that can react with the functional group of the monomer and having a carbon-carbon double bond while maintaining the radiation curing property of a carbon-carbon double bond.

Examples of the combination of these functional groups include a carboxylic acid group and an epoxy group, a carboxylic acid group and an aziridyl group, and a hydroxyl group and an isocyanate group. Among these combinations of the functional group, the combination of a hydroxyl group and an isocyanate group is preferable because of ease of pursuing the reaction. Further, the functional group may be in any side of the acrylic polymer and the above-describe compounds as long as these functional groups are combined to produce the acrylic polymer having a carbon-carbon double bond. However, the case where the acrylic polymer has a hydroxyl group and the above-described compound has an isocyanate group is preferable in the above-described preferable combination. In this case, examples of the isocyanate compound having a carbon-carbon double bond include methacryloylisocyanate, 2-methacryloyloxyethylisocyanate, and m-isopropenyl-α,α-dimethylbenzylisocyanate. Further, a polymer in which the hydroxyl group containing the monomers exemplified above and an ether based compound of 2-hydroxyethylvinylether, 4-hydroxybutylvinylether, diethylene glycol monovinylether, etc. are copolymerized can be used as the acrylic polymer.

A base polymer having a carbon-carbon double bond (especially, acrylic polymer) can be used alone as the internal-type radiation curable pressure-sensitive adhesive. However, the above-described radiation curable monomer component or oligomer component can be mixed to an extent that its characteristics do not deteriorate. The amount of the radiation curable oligomer component, etc. is normally within 30 parts by weight and preferably in the range of 0 to 10 parts by weight to 100 parts by weight of the base polymer.

A photopolymerization initiator is contained in the internal radiation curable pressure sensitive adhesive in the case of curing with radiation such as ultraviolet rays. Examples of the photopolymerization initiator include an α-ketol based compound such as 4-(2-hydroxyethoxy)phenyl(2-hydroxy-2-propyl)ketone, α-hydroxy-α,α'-dimethylacetophenone, 2-methyl-2-hydroxypropyophenone, and 1-hydroxy-cyclohexylphenylketone; an acetophenone based compound such as methoxyacetophenone, 2,2-dimethoxy-2-phenylcetophenone, 2,2-diethoxyacetophenone, and 2-methyl-1-[4-(methylthio)-phenyl]-2-morpholinopropane-1; a benzoinether based compound such as benzoinethylether, benzoinisopropylether, and anisoinmethylether; a ketal based compound such as benzyldimethylketal; an aromatic sulfonylchloride based compound such as 2-naphthalenesulfonylchloride; a photoactive oxime based compound such as 1-phenone-1,1-propanedion-2-(o-ethoxycarbonyl)oxime; a benzophenone based compound such as benzophenone, benzoylbenzoic acid and 3,3'-dimethyl-4-methoxybenzophenone; a thioxanthone based compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketone; acylphosphinoxide; acylphosphonate and the like. The compounding amount of the photopolymerization initiator is about 0.05 to 20 parts by weight for example based on 100 parts by weight of the base polymer such as an acryl polymer constituting the pressure sensitive adhesive.

Further, examples of the radiation curable pressure sensitive adhesive include a rubber based pressure sensitive adhesive and acryl-based pressure sensitive adhesive containing an addition polyerizable compound having two or more unsaturated bonds, a photopolymerizable compound such as alkoxysilane having an epoxy group, and a photopolymerization initiator such as a carbonyl compound, an organic sulfur compound, a peroxide, an amine salt-based and an onium salt based compound, which are disclosed in JP-A No. 60-196956.

The radiation curable pressure-sensitive adhesive layer 2 can contain a compound that colors by irradiation as necessary. By containing the compound that colors by irradiation in the pressure-sensitive adhesive layer 2, only the part that is irradiated with radiation can be colored. In other words, the part 2a corresponding to a work attaching part 3a shown in FIG. 1 can be colored. Therefore, it is possible to rapidly determine whether the pressure-sensitive adhesive layer 2 is irradiated with radiation by visual inspection, and the work attaching part 3a is easy to recognize, and bonding of the work is easy. In detecting a semiconductor chip by an optical sensor or the like, the detection accuracy is improved, and a malfunction does not occur at the time of pickup of the semiconductor chip. The compound that colors by irradiation is a compound that is colorless or light-colored before irradiation, but becomes colored by irradiation, and, for example, a leuco dye can be recited. The use rate of the compound that colors by irradiation can be set appropriately.

The thickness of the pressure sensitive adhesive layer 2 is not particularly limited. However, it is preferably about 1 to 50 μm from the viewpoints of compatibility of chipping prevention of the chip cut face and holding the fixation of the adhesive layer, etc. It is preferably 2 to 30 μm, and further preferably 5 to 25 μm.

The dicing tape 11 according to the present embodiment is manufactured for example as follows. First, the base material 1 can be formed with a conventionally known film forming method. Examples of the film forming method include a calendar film forming method, a casting method in an organic solvent, an inflation extrusion method in a closed system, a T die extrusion method, a coextrusion method, and a dry lamination method.

Next, the pressure-sensitive adhesive layer can be formed by coating a pressure-sensitive adhesive composition solution onto a base material to form a coating film, and then drying the coating film under prescribed conditions (and heat-crosslinking depending on necessity). The coating method is not especially limited, and examples thereof include roll coating, screen coating, and gravure coating. As the drying condition, drying is conducted, for example, at a drying temperature of 80 to 150° C. for a drying time of 0.5 to 5 minutes. After forming an applied film by applying a pressure-sensitive adhesive composition on a separator, the applied film may be dried in the above drying condition to form the pressure-sensitive adhesive layer 2. Thereafter, the pressure-sensitive adhesive layer 2 is bonded on the base material 1 together with the separator. In this manner, the dicing tape 11 is prepared.

The thermal bonding sheet with dicing tape 10, 12 can be produced in an ordinary method. For example, by bonding the pressure-sensitive adhesive layer 2 of the dicing tape 11 and the thermal bonding sheet 3, it is possible to produce the thermal bonding sheet with dicing tape 10.

In the thermal bonding sheet with dicing tape 10, it is preferred that the thermal bonding sheet 3 is covered with a separator. In one exemplary method, after bonding the dicing tape 11 and the thermal bonding sheet 3, the base separator that is laminated on the thermal bonding sheet 3 is peeled off, and on an exposed surface of the thermal bonding sheet 3 in the thermal bonding sheet with dicing tape 10 after peeling off the base separator, a separator is attached. In other words, it is preferred that the dicing tape 11, the thermal bonding sheet 3, and the separator are laminated in this sequence.

In the above embodiment, the thermal bonding sheet with dicing tape in which the dicing tape and the thermal bonding sheet are laminated was described. However, the thermal bonding sheet of the present invention may be provided in the state that it is not bonded with the dicing tape.

The thermal bonding sheet is preferably a thermal bonding sheet with both-side separators, which is sandwiched between two separators in the form where the dicing tape is not bonded. That is, a thermal bonding sheet with both-side separators in which the first separator, the thermal bonding sheet, and the second separator are laminated in this sequence is preferred.

Figure 4:
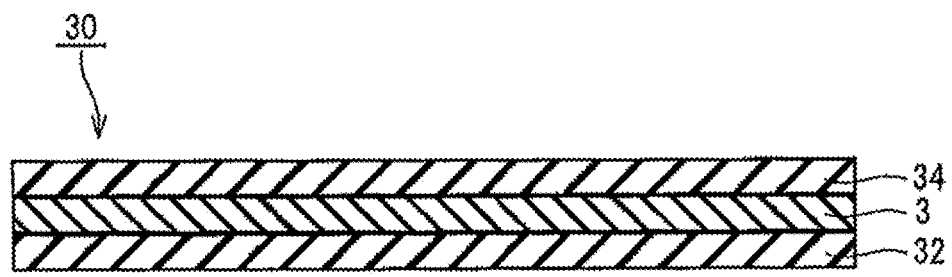
FIG. 4 is a cross-sectional schematic view showing a thermal bonding sheet with both-side separators.

FIG. 4 is a cross-sectional schematic view showing one embodiment of the thermal bonding sheet with both-side separators.

A thermal bonding sheet with both-side separators 30 shown in FIG. 4 has such a structure that a first separator 32, the thermal bonding sheet 3, and a second separator 34 are laminated in this sequence. As the first separator 32, and the second separator 34, the one that is identical to the base separator can be used.

The thermal bonding sheet may be in such a form that a separator is laminated on only one surface of the thermal bonding sheet in the form where the dicing tape is not bonded.

(Method of Manufacturing Semiconductor Device)

A method of manufacturing a semiconductor device according to the present embodiment includes:

a step of preparing the thermal bonding sheet, and a thermal bonding step of thermally bonding a semiconductor chip on an adherend via the thermal bonding sheet (hereinafter, also referred to as the first manufacturing method).

The method of manufacturing a semiconductor device according to the present embodiment also includes:

a step of preparing the thermal bonding sheet with dicing tape, a bonding step of bonding the thermal bonding sheet of the thermal bonding sheet with dicing tape, and a back surface of a semiconductor wafer, a dicing step of dicing the semiconductor wafer together with the thermal bonding sheet to form a chip-like semiconductor chip, a pickup step of picking up the semiconductor chip together with the thermal bonding sheet from the thermal bonding sheet with dicing tape, and a thermal bonding step of thermally bonding the semiconductor chip onto the adherend via the thermal bonding sheet (hereinafter, also referred to as the second manufacturing method).

The method of manufacturing a semiconductor device according to the first manufacturing method is different from the method of manufacturing a semiconductor device according to the second manufacturing method in that the thermal bonding sheet is used alone, as compared with the method of manufacturing a semiconductor device according to the second manufacturing method where the thermal bonding sheet with dicing tape is used, and these methods are common in other points. In the method of manufacturing a semiconductor device according to the first manufacturing method, after preparing the thermal bonding sheet, the step of bonding the thermal bonding sheet with the dicing tape is conducted, and the subsequent steps can be conducted in the same manner as the method of manufacturing a semiconductor device according to the second manufacturing method. Hereinafter, the method of manufacturing a semiconductor device according to the second manufacturing method is described.

In the method of manufacturing a semiconductor device, the thermal bonding sheet with dicing tape 10, 12 is prepared (preparing step). The separator that is optionally provided onto the thermal bonding sheet 3, 3' is appropriately peeled off, and the dicing thermal bonding sheet 10, 11 of the present invention is used as follows. The manufacturing method is explained below referring to FIG. 3 using the case of the thermal bonding sheet with dicing tape 10 as an example.

First, a semiconductor wafer 4 is fixed onto the semiconductor attaching part 3a of the thermal bonding sheet 3 in the thermal bonding sheet with dicing tape 10 by press-bonding and by adhering and holding (mounting step). The present step is performed while pressing with a pressing means such as a press-bonding roll. A temperature upon mounting is not particularly limited, and is preferably in the range of 23 to 90° C.

As a semiconductor wafer 4, the one in which an electrode pad is formed on one side, and a gold thin film, silver thin film or copper thin film is preferably formed on the outermost surface of the other side (hereinafter, also referred to as backside) is preferred. In addition, on the outermost surface of the backside of the semiconductor wafer 4, it is preferable to form a thin film containing the same kind of metal as the sinterable metal fine particles included in the precursor layer 31. The thickness of the silver thin film can be, for example, 10 nm to 1000 nm. Between the semiconductor wafer 4 and the silver thin film, a titanium thin film may further be formed. The thickness of the titanium thin film can be, for example, 10 nm to 1000 nm. When the gold thin film, silver thin film or copper thin film is formed, it is possible to thermally bond a semiconductor chip 5 and the thermal bonding sheet 3 firmly in the later-described thermal bonding step. Also, when the titanium thin film is formed, the reliability of the electrode is improved. The silver thin film, and the titanium thin film can be formed, for example, by vapor deposition.

Next, dicing of the semiconductor wafer 4 is performed (dicing step). With this operation, a semiconductor chip 5 is formed by cutting the semiconductor wafer 4 into a prescribed size to make it into individual pieces. The dicing method is not particularly limited, but is performed following an ordinary method from the circuit face side of the semiconductor wafer 4, for example. Further, a cutting method, so-called full cut, in which cutting-in is performed to the thermal bonding sheet with dicing tape 10, can be adopted in the present step, for example. The dicing apparatus that is used in the present step is not especially limited, and a conventionally known apparatus can be used. Further, because the semiconductor wafer 4 is adhered and fixed by the thermal bonding sheet with dicing tape 10, chip breakage and chip fly can be suppressed, and at the same time, damage of the semiconductor wafer 4 can be suppressed.

Picking up of the semiconductor chip 5 is performed to peel off the semiconductor chip that is adhered and fixed to the thermal bonding sheet with dicing tape 10 (pickup step). The method of picking up is not especially limited, and various conventionally known methods can be adopted. Examples thereof include a method of pushing up an individual semiconductor chip 5 from the thermal bonding sheet with dicing tape 10 side using a needle and picking up the semiconductor chip 5 that is pushed up with a picking up apparatus.

As the pickup condition, a needle pushing up rate is preferably 0.5 to 100 mm/sec., more preferably 5 to 10 mm/sec. in terms of prevention of chipping.

Here, the pickup is performed after irradiating the pressure-sensitive adhesive layer 2 with the ultraviolet ray if the pressure-sensitive adhesive layer 2 is of a radiation curable. With this operation, the adhesive strength of the pressure-sensitive adhesive layer 2 to the thermal bonding sheet 3 decreases, and the semiconductor chip 5 is easily peeled off. As a result, the pickup becomes possible without damaging the semiconductor chip. The conditions during ultraviolet ray irradiation such as the radiation strength and the radiation time are not especially limited, and may be appropriately set as necessary. Any known light source for irradiation with ultraviolet ray can be used. When the pressure-sensitive adhesive layer is cured in advance by irradiating with ultraviolet rays, and the cured pressure-sensitive adhesive layer and the thermal bonding sheet are bonded, the irradiation with ultraviolet rays here is not required.

Then, the picked semiconductor chip 5 is die attached (thermally bonded) to an adherend 6 via the thermal bonding sheet (thermal bonding step). Examples of the adherend 6 include a lead frame, a TAB film, a substrate, and a semiconductor chip that is separately produced. The adherend 6 may be a deformable adherend that can be deformed easily or may be a non-deformable adherend such as a semiconductor wafer that is difficult to be deformed.

Metal lead frames such as a Cu lead frame and a 42 Alloy lead frame can be used as the lead frame. As the substrate, a conventionally known one can be used. An organic substrate made of glass epoxy, BT (Bismaleimide-Triazine), polyimide, and the like can be exemplified. Among these, by using a metal lead frame, it is possible to integrate with the metallic fine particles by thermal bonding. As the substrate, an insulating circuit substrate in which a coper circuit board is laminated on an insulating board such as a ceramic plate can be recited. By using an insulating circuit substrate, it is possible to produce, for example, a power semiconductor device that controls or supplies electric power.

At least a part of the surface of the adherend preferably contains gold, silver or copper. In this case, the surface of the adherend preferably contains the same kind of metal as the sinterable metal fine particles included in the precursor layer 31. When at least a part of the surface of the adherend contains gold, silver or copper, the affinity with the thermal bonding sheet or the bonding wire can be enhanced to improve the bonding reliability with them. From the viewpoint of improving the durability and weather resistance, gold or silver is preferable, and copper is preferable in terms of cost reduction.

In the thermal bonding step, metallic fine particles are sintered by heating, and a thermally decomposable binder is thermally decomposed as necessary. Also, the residual low-boiling-point binder that has not completely volatilized in the drying step is caused to volatilized. The heating temperature can be preferably 180 to 400° C., more preferably 190 to 370° C., further preferably 200 to 350° C. The heating time can be preferably 0.3 to 300 minutes, more preferably 0.5 to 240 minutes, further preferably 1 to 180 minutes. The thermal bonding may be conducted under a pressurized condition. The pressurizing condition is preferably within the range of 1 to 500 kg/cm², more preferably within the range of 5 to 400 kg/cm². The thermal bonding under a pressurized condition can be carried out by an apparatus capable of conducting heating and pressurizing simultaneously such as flip chip bonder, for example. Parallel plate pressing is also applicable.

Figure 5:
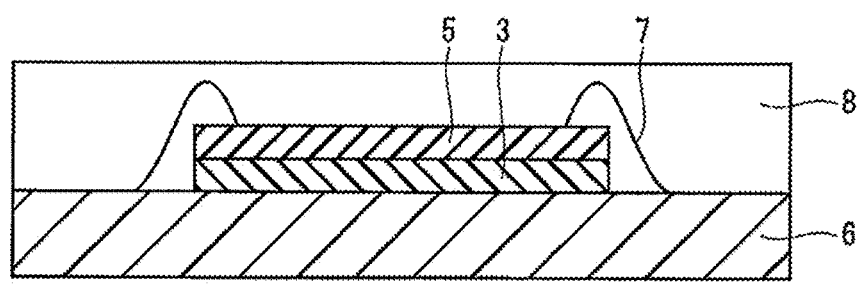
FIG. 5 is a cross-sectional schematic view for illustrating a method of manufacturing a semiconductor device according to one embodiment of the present invention.

Next, if necessary, as depicted in FIG. 5, the tip of a terminal part (inner lead) of the adherend 6 is electrically connected to an electrode pad (not shown in the figures) on the semiconductor chip 5 with a bonding wire 7 (wire bonding step). Examples of the bonding wire 7 that can be used include a gold wire, an aluminum wire, and a copper wire. The temperature when performing the wire bonding is in the range of 23 to 300° C. and preferably in the range of 23 to 250° C. The heating time is a few seconds to a few minutes. The connection is in a heated state so that the temperature becomes in the above-described range, and it is performed using both the vibration energy due to ultrasonic waves and the compression energy due to the applied pressure.

Further, if necessary, the semiconductor chip 5 is sealed with a sealing resin 8 as shown in FIG. 5 (sealing step). The present step is performed to protect the semiconductor chip 5 and the bonding wire 7 that are mounted on the adherend 6. The present step is performed by molding a resin for sealing with a mold. Example of the sealing resin 8 that is used include epoxy resins. The resin sealing is performed normally at a heating temperature of 175° C. for 60 to 90 seconds. However, the present invention is not limited to this and it can be performed by curing at 165 to 185° C. for a few minutes for example. With this, the sealing resin 8 is cured. In the present sealing step, a method of embedding the semiconductor chip 5 into a sheet-like sealing sheet (see, JP-A 2013-7028, for example) can also be employed. Besides the molding of a sealing resin by a die, a gel sealing type in which silicone gel is poured into a case type container is also applicable.

The sealing resin 8 that is not sufficiently cured in the sealing step is cured completely by heating (post curing step). The heating temperature in the present step differs depending on the type of the sealing resin. However, it is in the range of 165 to 185° C. for example, and the heating time is about 0.5 to 8 hours.

The thermal bonding sheet, and the thermal bonding sheet with dicing tape according to the present invention can be favorably used in laminating a plurality of semiconductor chips to achieve three-dimensionally mounting. At this time, a thermal bonding sheet and a spacer may be laminated between semiconductor chips, or not a spacer but only a thermal bonding sheet may be laminated between semiconductor chips, and these can be appropriately changed depending on the manufacturing condition, use application and the like.

Also, the thermal bonding sheet, and the thermal bonding sheet with dicing tape of the present invention can be used for thermally bonding two objects without limited to the application exemplified above.

EXAMPLES

Hereinafter, the present invention will be specifically described by Examples, however, the present invention is not limited to the following Examples without departing from the scope of the invention.

The components used in the examples were as follows.

Sinterable metallic particle-containing paste: 6 parts by weight of isobornyl cyclohexanol (MTPH, molecular weight: 236) as a low boiling point binder and 5 parts by weight of methyl ethyl ketone (MEK) were added to 100 parts by weight of copper powder (manufactured by Mitsui Mining & Smelting Co., average particle diameter: 0.2 μm) were added and stirred to obtain the paste (each component was charged into a rotation/revolution mixer (manufactured by Shinky, ARE-310) and stirred at 2000 rpm for 15 minutes).

Thermally decomposable binder A: PPC (polypropylene carbonate resin), "QPAC 40" manufactured by Empower, weight average molecular weight: 289,000

Thermally decomposable binder B: PiBMA (polyisobutyl methacrylate resin), "MM 2002" manufactured by Fujikura Kasei Co., Ltd., weight average molecular weight: 170,000

Organic solvent: methyl ethyl ketone (MEK)

Examples 1 to 3 and Comparative Example 1

100 parts by weight of the sinterable metallic particle-containing paste, 7 parts by weight of the thermally decomposable binder as shown in Table 1 and 45 parts by weight of the organic solvent were charged into a rotation/revolution mixer (made by Shinky, ARE-310), and the mixture was stirred at 2000 rpm for 8 minutes to prepare a varnish. The obtained varnish was coated on a release-treated film ("MRA 38" manufactured by Mitsubishi Plastics, Inc.) and dried. Coating was carried out using an applicator so that the thickness of the coating film after drying was 70 µm. Drying was carried out with an explosion-proof dryer. The drying condition was at 80° C. for 2 minutes. In this way, thermal bonding sheet with a thickness of 70 µm was obtained.

<<Evaluation>>

With respect to the following items, samples of Examples and Comparative Example were evaluated. The results are shown in Table 1.

(SEM Observation of Phase Separation Structure and Measurement of Maximum Value Among Diameters of Largest Inscribed Circles)

Figure 6:
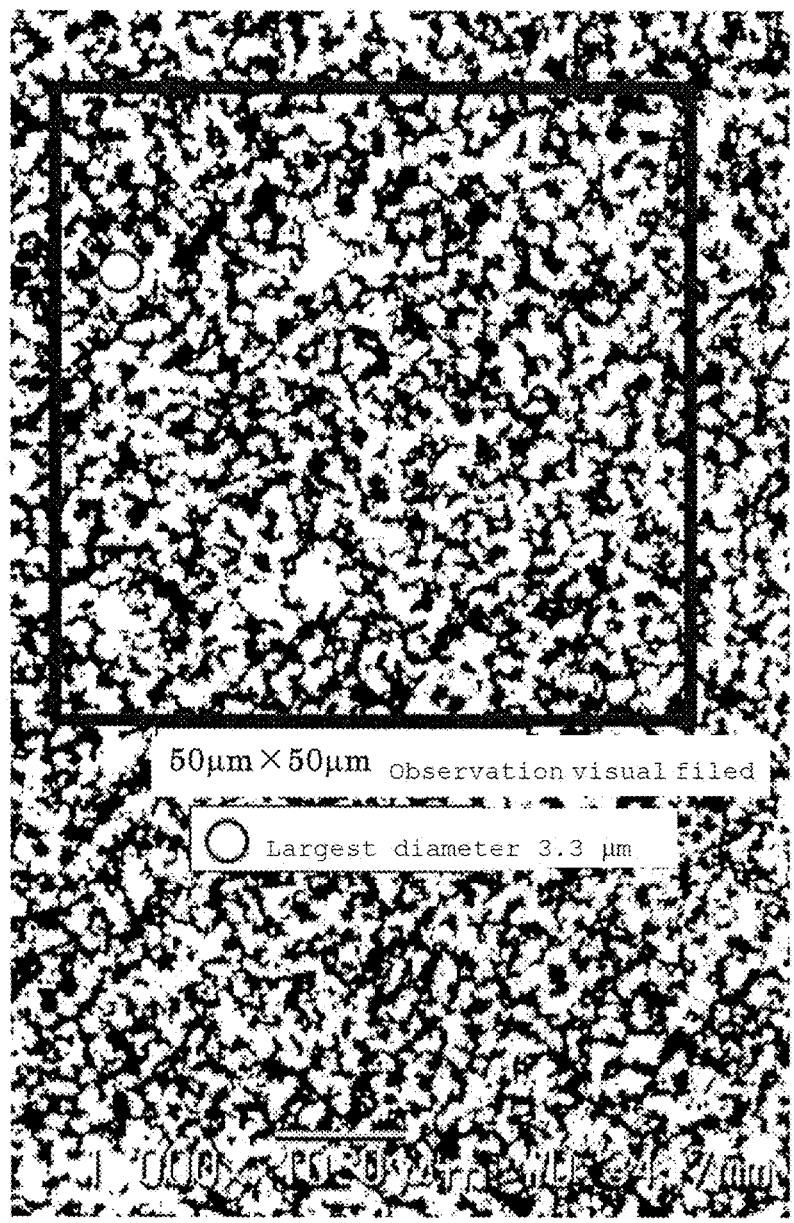
FIG. 6 is a SEM surface observation image about a thermal bonding sheet of Example 1.

Images were taken with a scanning electron microscope (SEM) at an acceleration voltage of 5 kV and a magnification of 1000 times with respect to the central part of the exposed surface of the precursor layer of the thermal bonding sheet. Measurement conditions were set so that the gradation histogram (256 divisions with tones of 0 to 255) of the image taken for later image analysis did not deviate extremely within the range of 0 to 255. For this purpose, for example, it is preferable to apply a command to automatically select the optimum contrast and brightness, such as "auto contrast" and "auto brightness" in the observation software, and then perform photographing. FIG. 6 shows a SEM surface observation image obtained for the heat bonding sheet of Example 1. From the obtained SEM surface observation image, three regions of 50 µm×50 µm were randomly cut out as an observation visual field. FIG. 6 shows an observation visual field at one of them. Using an image analysis software ("imageJ" which is an open source software developed at the National Institute of Health), in the phase separation structure of the cut observation visual field, inscribed circles in contact with the boundary line of each phase defining phase separation were drawn on the area occupied by each phase.

Specifically, using the above image analysis software, the bright phase and the dark phase of the SEM surface observation image were binarized to make a black and white display, and the boundary between the white part and the black part was set as a boundary line of each phase defining the phase separation. Binarization of bright and dark parts was performed as follows. When the histogram displayed in the "B & C" window appearing by selecting the command of the menu bar of the image analysis software in the order of "Image", "Adjust" and "Brightness/Contrast" included two or more peaks, the lowest frequency point between the first most frequent peak and the second most frequent peak was taken as the boundary, a part of less than the boundary was binarized as black, and a part equal to or more than the boundary as white. In the case where the histogram did not include two or more peaks (in the case of one peak), 0 to 127 and 128 to 255 out of 256 divisions with tones of 0 to 255 were binarized as a black part and a white part, respectively. In the phase separation structure shown in FIG. 6, an inscribed circle was drawn for the region occupied by each of the light phase and the dark phase. The diameter of the largest inscribed circle having the largest diameter among the inscribed circle of each phase was read, and the maximum value among the diameter of the largest inscribed circle for each phase was obtained to be the largest diameter [µm].

A SEM central part observation image of the central part of the sheet in the thickness direction was obtained by the following procedure. A thermal bonding sheet was cut along a plane perpendicular to the longitudinal direction of the sheet passing through the center part of the sheet surface and cryoion polished (using TIC-3X manufactured by Leica, acceleration voltage: 6 kV, processing temperature: −20° C.). A SEM observation image was photographed for the central part of the obtained polished surface. The photographing condition of the central part in the thickness direction was an accelerating voltage of 2 kV and a magnification of 2000 times.

(Measurement of Area Ratio of Black Part in Binarized SEM Observation Image)

Regarding the above SEM surface observation image, using an image in which the bright phase and the dark phase were binarized and displayed as black and white, the area ratio of the black part in the entire observation visual field was determined by image analysis. With respect to the SEM central part observation image, using an image in which the bright phase and the dark phase were binarized and displayed as black and white, an area ratio of the black part in an area (1 µm (thickness direction)×20 µm (perpendicular to the thickness direction)) of the center of the black and white display image was determined by image analysis.

(Method for Calculating Polarity Term $\delta p$ of Solubility Parameter (SP Value))

The polar term $\delta p$ of the SP value was obtained from the following equation (from J. Appl. Polym. Sci., 1975, 19, 1163).

$$\delta p = 50.1 \times \{\mu/(Vm)^{3/4}\}$$

(in the equation, $\mu$ is a dipole moment of a target compound. When the target compound is a polymer, $\mu$ of the polymer can be obtained by measuring a dipole moment $\mu'$ of a main monomer of the polymer or by searching for the literature value of $\mu'$, followed by multiplying this $\mu'$ by 0.8. Vm is a value obtained by dividing a molecular weight of the target compound (the molecular weight of the main monomer in the case where the target compound is a polymer) by a density of the target compound (a density of the main monomer in the case where the target compound is a polymer). The term "main monomer" refers to a monomer having the highest existing molar ratio in the target polymer component. The monomer constituting the polymer component can be identified by extracting the organic component from the sheet by solvent extraction or the like, and determining the structure of the polymer component by nuclear magnetic resonance (NMR) after fractionation by GPC.

(Reliability Evaluation—Measurement of Remaining Bonding Area Ratio)

A silicon chip (a silicon chip having a thickness of 350 µm, a length of 5 mm, and a width of 5 mm) having a Ti layer (thickness of 50 nm) and an Ag layer (thickness of 100 nm) formed in this order on the back surface was prepared. The prepared thermal bonding sheet was overlaid on the Ag layer surface of the prepared silicon chip. In this state, it was passed through a laminator. Conditions of the laminator were temperature of 70° C., pressure of 0.3 MPa, speed of 10 mm/sec.

Separately, a copper plate (copper plate with thickness of 3 mm) whose entire surface was covered with an Ag layer (thickness of 5 µm) was prepared. Onto the prepared copper plate, a thermal bonding sheet with a silicon chip (prepared as above) was temporarily adhered. The pressure at the time of temporary adhesion was 0.1 MPa. Further, at the time of temporary adhesion, the copper plate was previously heated to 70° C. This was used for evaluation of Example 1 and Comparative Example 1.

Moreover, a copper plate (copper plate with thickness of 3 mm) whose entire surface was covered with an Au layer (thickness of 0.1 μm) was prepared. Onto the prepared copper plate, a thermal bonding sheet with a silicon chip (prepared as above) was temporarily adhered. The pressure at the time of temporary adhesion was 0.1 MPa. Further, at the time of temporary adhesion, the copper plate was previously heated to 70° C. This was used for evaluation of Example 2.

Further, a copper plate (copper plate with thickness of 3 mm) whose surface was not covered was prepared. Onto the prepared copper plate, a thermal bonding sheet with a silicon chip (prepared as above) was temporarily adhered. The pressure at the time of temporary adhesion was 0.1 MPa. Further, at the time of temporary adhesion, the copper plate was previously heated to 70° C. This was used for evaluation of Example 3.

Subsequently, the temporarily adhered thermal bonding sheet was sintered under pressing and heating conditions to bond the silicon chip and the copper plate (pressure of 10 MPa, heating rate of 90° C./min, sintering temperature of 300° C., sintering time of 5 minutes). For the bonding, a sintering apparatus (HTM-3000, manufactured by Hakuto Co., Ltd.) was used. The pressing was carried out by a flat plate press, and the pressing was always maintained during the heating step and the sintering step. In addition, the atmosphere during the heating and the sintering was set to nitrogen atmosphere.

After the heating (after completion of the sintering step), air-cooling was carried out until 170° C., and thereafter water-cooling was carried out until 80° C. Water-cooling was carried out by a water-cooled cooling plate provided in the pressing plate. Thus, a sample for evaluation was obtained.

Next, the evaluation sample was placed in a cooling-thermal shock test machine ("TSE-103ES" manufactured by ESPEC Corp.), and subjected to a cooling-thermal shock of −40° C. to 200° C. for 100 cycles. At this time, the temperature was held at −40° C. and 200° C. for 15 minutes, respectively.

After 100 cycles, using an ultrasonic imaging apparatus [SAT] ("FineSAT II" manufactured by Hitachi Construction Machinery Finetech Co., Ltd.), in order to confirm the part where the silicon chip and the copper plate were bonded by the sintered layer, imaging was carried out. The transducer (probe) used was PQ-50-13: WD [frequency of 50 MHz] and the imaging mode was "reflection".

with the image analysis software used in the SEM observation, the area (remaining bonding area) of the part where boding remained in the obtained image was obtained, and the ratio of the remaining bonding area to the entire area (remaining bonding area ratio) was calculated. The image obtained by the ultrasonic imaging apparatus was binarized and displayed in binary so that the part where the silicon chip and the copper plate were peeled off was white, and the part where the bonding remained was black (the threshold value was 127. Among the histogram divided into 256 divisions with tones of 0 to 255, 0 to 127 were binarized as a black part and 128 to 255 were binarized as a white part). A case where the remaining bonding area ratio was 70% or more was evaluated as "O", and a case where the remaining bonding area ratio was lower than 70% was evaluated as "x".

TABLE 1

| | | Example 1 | Example 2 | Example 3 | Comparative Example 1 |
|---|---|---|---|---|---|
| Polymer component | Kind | PPC | PPC | PPC | PiBMA |
| | Polarity term of SP value | 7.3 | 7.3 | 7.3 | 2.3 |
| Low molecular component | Kind | MTPH | MTPH | MTPH | MTPH |
| | Polarity term of SP value | 1.4 | 1.4 | 1.4 | 1.4 |
| Maximum value of absolute value of difference between polarity terms of SP values of solid material and liquid material | | 5.9 | 5.9 | 5.9 | 0.9 |
| Maximum value of diameter of largest inscribed circle of each phase [μm] | | 3.3 | 3.3 | 3.3 | 0.5 |
| Area ratio of black part to the entire binarized SEM surface observation image [%] | | 77 | 77 | 77 | 2 |
| Area ratio of black part in the central area (1 μm × 20 μm) of binarized SEM central part observation image [%] | | 41 | 41 | 41 | 7 |
| Surface material of adherend (copper plate) [%] | | Silver | Gold | Copper | Silver |
| Sinter bonding reliability of sheet | | ○ | ○ | ○ | x |

(Results and Consideration)

In Examples 1 to 3, the reliability evaluation was good. On the other hand, in Comparative Example 1, the reliability evaluation was inferior. This is presumed to be due to the fact that in Comparative Example 1, the maximum value of the diameter of the largest inscribed circle for the phase separation structure was less than 1 μm, each degree of dispersion of the sinterable metallic particles and the organic component was high, and high temperature shift of the decomposition temperature of the organic component and inhibition of sintering of the sinterable metallic particles by the organic component occurre

REFERENCE CHARACTERS LIST

1: Base material
2: Pressure-sensitive adhesive layer
3, 3': Thermal bonding sheet
4: Semiconductor wafer
5: Semiconductor chip
6: Adherend
7: Bonding wire
8: Sealing resin 10, 12: Thermal bonding sheet with dicing tape
11: Dicing tape
30: Thermal bonding sheet with both-side separators
31: Precursor layer that is to become a sintered layer by heating
32: First separator
34: Second separator
Pi: Phase of island (of sea-island structure)
Ps: Phase of sea (of sea-island structure)
Ci: Largest inscribed circle of phase of island
Cs: Largest inscribed circle of phase of sea
Di: Diameter of largest inscribed circle of phase of island
Ds: Diameter of largest inscribed circle of phase of sea
P1: First phase (of co-continuous structure)
P2: Second phase (of co-continuous structure)
C1: Largest inscribed circle of first phase
C2: Largest inscribed circle of second phase
D1: Diameter of largest inscribed circle of first phase
D2: Diameter of largest inscribed circle of second phase

The invention claimed is:

1. A thermal bonding sheet, comprising a precursor layer that is to become a sintered layer by heating,
wherein
the precursor layer includes sinterable metallic particles and an organic component,
the precursor layer has a phase separation structure that is a sea-island structure or a co-continuous structure,
in a SEM surface observation image on at least one surface of the precursor layer, a maximum value among each diameter of the largest inscribed circle for a region occupied by each phase of the phase separation structure is 1 μm or more and 50 μm or less, and
the phase separation structure is formed between a phase in which the sinterable metallic particles aggregate and a phase in which the organic component aggregates.

2. The thermal bonding sheet according to claim 1, wherein the organic component includes a low molecular component having a weight average molecular weight of 1000 or less and a polymer component having a weight average molecular weight of 5000 or more, and
a maximum value of an absolute value of a difference between a polarity term of a solubility parameter of the low molecular component and a polarity term of a solubility parameter of the polymer component is 3 or more and 15 or less.

3. The thermal bonding sheet according to claim 1, wherein
when the SEM surface observation image is binarized to make black and white display, an area ratio of a black part to the entire SEM surface observation image is 10 to 80%, and
when a SEM central part observation image at a central part of the precursor layer in its thickness direction is binarized to make black and white display, an area ratio of the black part to the entire SEM central part observation image is 1 to 60%.

4. The thermal bonding sheet according to claim 1, wherein
the precursor layer is configured to thermally bond to a semiconductor chip on one side and an adherend on another side, at least a part of each surface of the semiconductor chip and the adherend including gold, silver or copper.

5. The thermal bonding sheet according to claim 1, wherein the precursor layer is configured to be laminated with dicing tape.

6. The thermal bonding sheet according to claim 1, wherein the organic component includes a low molecular component having a weight average molecular weight of 1000 or less, and the low molecular component is at least one low-boiling-point binder selected from the group consisting of pentanol, hexanol, heptanol, octanol, 1-decanol, ethylene glycol, diethylene glycol, propylene glycol, butylene glycol, α-terpineol, 1,6-hexanediol, and isobornyl cyclohexanol (MTPH), ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butylmethyl ether, diethylene glycol isopropylmethyl ether, triethylene glycol dimethyl ether, triethylene glycol butylmethyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether, ethylene glycol ethyl ether acetate, ethylene glycol butyl ether acetate, diethylene glycol ethyl ether acetate, diethylene glycol butyl ether acetate, and dipropylene glycol methyl ether acetate.

7. The thermal bonding sheet according to claim 1, wherein the organic component includes a polymer component having a weight average molecular weight of 5000 or more, and the polymer component is a thermally decomposable binder that thermally decomposes at 190° C. to 370° C.

* * * * *